United States Patent [19]
Jeske

[11] Patent Number: 5,731,674
[45] Date of Patent: Mar. 24, 1998

[54] MOTOR WITH VARIABLE EDGE STEEPNESS

[75] Inventor: Frank Jeske, Tennenbronn, Germany

[73] Assignee: Papst-Motoren GmbH & Co. KG, St. Georgen, Germany

[21] Appl. No.: 578,732

[22] Filed: Dec. 26, 1995

[30] Foreign Application Priority Data

Jan. 14, 1995 [DE] Germany .................. 29500551 U

[51] Int. Cl.[6] ...................................................... H02P 7/00
[52] U.S. Cl. .......................... 318/439; 318/254; 388/934; 388/815
[58] Field of Search ..................... 318/254, 138, 318/439, 434; 388/803, 806, 811, 815, 816, 819, 903, 934, 915

[56] References Cited

U.S. PATENT DOCUMENTS

| | | | |
|---|---|---|---|
| Re. 34,609 | 5/1994 | Müller | 318/254 |
| 4,286,198 | 8/1981 | De Valroger | 318/138 |
| 4,385,265 | 5/1983 | Uzuka et al. | 318/138 |
| 4,415,844 | 11/1983 | Mendenhall et al. | 318/254 |
| 4,556,829 | 12/1985 | Von De Heide | 318/254 |
| 4,748,386 | 5/1988 | Nakanishi et al. | 318/254 |
| 4,814,674 | 3/1989 | Hrassky | 318/254 |
| 5,043,642 | 8/1991 | Ohi | 318/254 |
| 5,144,209 | 9/1992 | Inagi et al. | 318/254 |
| 5,182,499 | 1/1993 | Inagi et al. | 318/254 |
| 5,197,858 | 3/1993 | Cheng | 417/14 |
| 5,349,275 | 9/1994 | Müller | 318/254 |
| 5,563,480 | 10/1996 | Okada | 388/815 |

FOREIGN PATENT DOCUMENTS

| | | |
|---|---|---|
| 0 499 503A1 | 8/1992 | European Pat. Off. . |
| 0 534 447A1 | 3/1993 | European Pat. Off. . |
| 208 894 B1 | 4/1984 | German Dem. Rep. . |
| 31 07 623A1 | 12/1981 | Germany . |
| 32 47 359A1 | 8/1983 | Germany . |
| 33 42 031A1 | 5/1984 | Germany . |
| 35 37 403A1 | 4/1987 | Germany . |
| 39 40 569 C2 | 5/1992 | Germany . |

OTHER PUBLICATIONS

Sanyo Electric, datasheet # 3519, "LB1860 Variable Speed Fan Motor Drivers."

Rolf Müller, "Zweipulsige kollektorlose Gleichstrommotoren," ASR–Digest, pp. 27–31 (1977).

IBM RAMAC ad, "two cooling fans . . . to avoid overheating", INFOWORLD, vol. 17, Issue 51, Dec. 18, 1995.

Primary Examiner—Jonathan Wysocki
Attorney, Agent, or Firm—Milton Oliver

[57] ABSTRACT

An improved motor for driving a variable-speed fan used, for example, to prevent overheating of electronic equipment, features an electronic controller which sends current pulses through the stator winding(s) of the motor, and varies the slope of trailing edges of these pulses in accordance with at least one sensed operating parameter of the motor, such as temperature of the power semiconductors which control the motor current. The slopes are steepened at high motor speeds to reduce electrical losses, and flattened at low motor speeds to minimize noise. Another feature of the improved motor provides for fail-safe, high-speed operation of the fan when the sensed value of the operating parameter is implausible, for example when a lead from a temperature-dependent sensing resistor breaks. In a preferred embodiment, a bridge circuit is used, which includes a transistor in one diagonal of the bridge circuit. Currently marketed personal computers use central processor chips containing several million transistors, which generate heat, and adequate, reliable cooling is absolutely essential to their proper operation. The present invention improves reliability.

14 Claims, 9 Drawing Sheets

MOTOR WITH VARIABLE EDGE STEEPNESS

FIELD OF THE INVENTION

The present invention relates generally to an electronically commutated motor and, more particularly, to an improved motor adapted to drive a variable-speed fan, e.g. for computer cooling.

BACKGROUND

Similar motors have been used in variable-speed fans sold under the trademark VARIOFAN by Papst-Motoren of St. Georgen, Germany. These fans are sometimes used for cooling in desktop computers, where fan noise creates distraction and any radio-frequency interference is undesirable.

SUMMARY OF THE INVENTION

Accordingly, it is an object of the present invention to provide an improved motor which reduces both noise and radio-frequency (RF) interference.

Briefly, this is accomplished by controlling steepness of the trailing edge of the current pulses which drive the motor. In such an electronically commutated motor, typically there is at least one stator winding, and during each 360° (el) turn of the rotor, at least two current pulses are fed to the stator winding. The present invention features means for controlling steepness of the shutoff edge of each current pulse, together with a motor-parameter-dependent device which controls this steepness controller. In accordance with the invention, when load on the motor is low, the motor is operated with relatively flat shutoff edges, and thus low noise, while when load on the motor is high, the motor is operated with steep shutoff edges, which minimizes electrical losses in the associated electronic circuit, but results in higher motor noise.

In a preferred embodiment of such a motor, the motor-parameter-dependent device controls in accordance with the temperature of the power semiconductor(s), and so controls the steepness controller that, as the detected temperature increases, the steepness of the current pulse shutoff edges is increased. Such an arrangement operates in practice as an electronic protection against overheating of the power semiconductors, since the steeper the shutoff edges get (as temperature increases), the less the electrical losses in these power semiconductors become. Thus, by such an arrangement, these losses are reduced as, and whenever, temperature increases.

In another advantageous embodiment of the invention, the motor-parameter-dependent device either depends upon the rotation speed or specifies the rotation speed, and so controls the steepness controller that, as rotation speed increases, the edge steepness is increased. This makes it possible to so control the motor that, at low rotation speeds, the edge steepness is controlled to keep motor noise low, and at high rotation speeds, the edges are automatically made steep, in order to obtain maximum mechanical output power from the motor. The increased motor noise at high rotation speeds is generally tolerable because it is masked by the overall noise level of the device, e.g. the increased air noise of the fan driven by the motor.

In a particularly simple embodiment, the motor-parameter-dependent device includes a temperature-dependent resistor. This provides the great advantage that resistance values of the temperature-dependent resistor falling outside a predetermined value range will have no additional influence on the edge steepness and/or rotation speed of the motor. This is particularly advantageous at low temperatures, at which a Negative Temperature Coefficient (NTC) resistance can take on a very high resistance value, which in a temperature-controlled motor could lead to a very low rotation speed, which is undesired. Equally, a too-low steepness of the shutoff edges would be undesirable, since it would offer no further noise reduction, yet would worsen the operating efficiency of the motor.

Another solution to the aforementioned task of reducing noise and RF interference is provided by an embodiment in which a SANYO integrated circuit model LB 1860M is used in combination with an additional temperature-dependent resistance, as shown in FIGS. 8–9.

Since the temperature-dependent resistors used are often located outside the motor, e.g. adjacent the power supply of a computer, there is a constant danger that a connecting line to such a resistor will break. If the resistor is an NTC resistor, this has the result, that a signal is generated, which would correspond to a very low temperature, i.e. a fan in this case would rotate very slowly, even if the temperature in the computer became very high. A fail-safe means in the control circuit assures that, in such a case, the motor is switched to a high rotation speed, so that no damage could occur, even in the event of such a conductor break. The user would notice, from the constant high rotation speed, that something was wrong, and could have the fan repaired or replaced.

Additional features and advantageous refinements of the invention will be apparent from the following descriptions of preferred embodiments, which are to be construed as illustrative only, not as limitations of the invention.

BRIEF FIGURE DESCRIPTION

DETAILED DESCRIPTION

Figure 1:
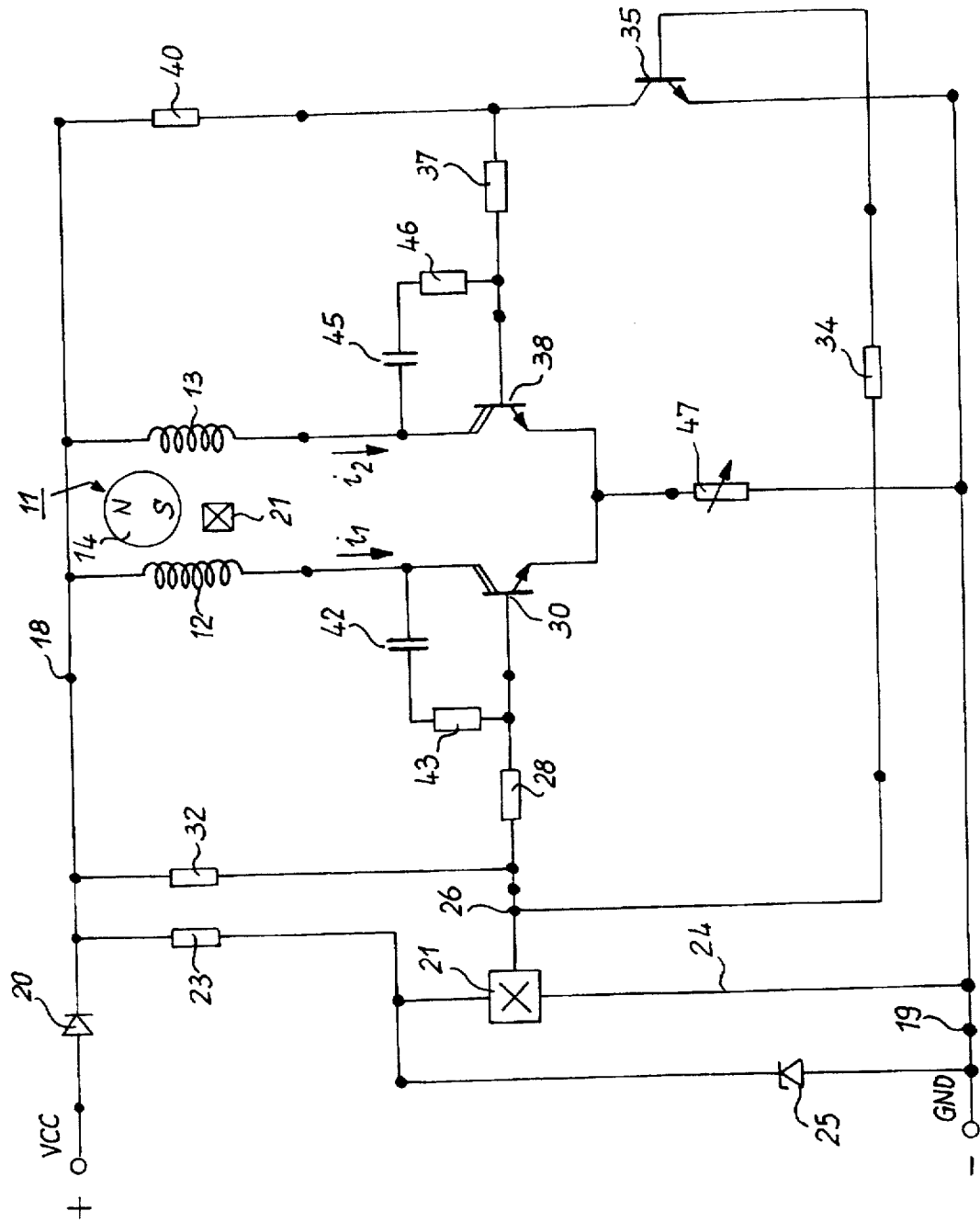
FIG. 1 is a circuit diagram of a two-pulse electronically commutated motor of a known type, into which means for noise reduction have been added.
Figure 2:
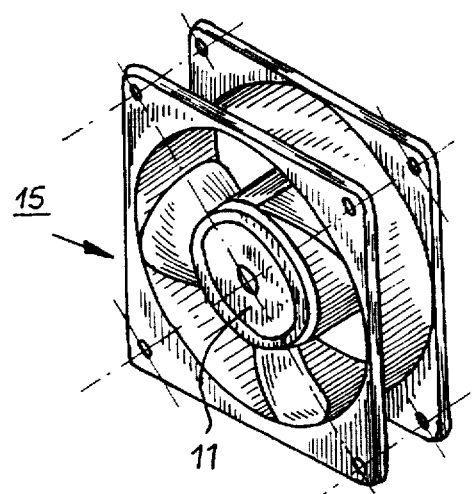
FIG. 2 illustrates a typical device ventilating fan, whose motor can feature the circuit of FIG. 1 or of one of the circuits illustrated and described below.

FIG. 1 illustrates a circuit for a so-called two-pulse, two-stranded Electronically Commutated Motor (ECM) 11, which has two winding strands 12, 13, and a permanent-magnet rotor 14, indicated only schematically. As shown in FIG. 2, this motor 11 can be located in the hub of an apparatus ventilating fan 15, which motor 11 drives. The driving is often accomplished with variable rotational speed. If the temperature of the apparatus to be cooled is low, fan 15 can run at a low speed. If the temperature is high, the rotational speed must also be high.

The terms "two-pulse" and "two-stranded" are defined in more detail in an article by Roll Müller in ASR-Digest f ürr angewandte Antriebstechnik, pp. 27–31 (1977). The invention is well adapted for use with single-stranded, two pulse motors, and can also be advantageously used with single-pulse motors. The invention is also adapted for use with motors having higher pulse counts (three-pulse, etc.) and higher strand counts, and enables, in each case, noise reduction at low rotational speeds, without impairing power output at high speeds.

At low rotational speeds, a fan should run so quietly that one hears from it only a faint whisper or murmur. Motor noises must therefore be strictly avoided. At high rotational speeds, a fan is always loud, and, in this case, motor noise (structure-borne noise) is not disturbing because it is masked by or subsumed in the overall fan noise, the so-called air-transmitted noise.

In the motor according to FIGS. 1 and 2, the rotational speed can be increased by increasing the voltage $V_{cc}$ applied between a positive conductor 18 and a negative conductor 19. As in every direct-current motor, this increases the rotational speed, and the fan 15 runs correspondingly faster and transports more air.

In the positive line 18, a diode 20 is provided to protect the motor against erroneous application of wrong-polarity voltage. Adjacent to rotor 14, a rotational position sensor in the form of a Hall-IC 21 is provided; Hall sensor 21 is also shown in FIG. 1 on the left side. Its first terminal is connected via a resistor 23 to positive conductor 18, while its other terminal is connected via a line 24 with negative conductor 19. Parallel to this connection is a Zener diode 25, which holds the voltage on the connection constant, e.g. at 5 volts.

Signal output 26 of Hall IC 21 is connected via a resistor 28 with the base of an NPN Darlington transistor 30, further via a resistor 32 with the positive conductor 18, and via a resistor 34 with the base of a phase-inversion transistor 35 (NPN), whose emitter is connected to negative conductor 19 and whose collector is connected via a resistor 37 with the base of an NPN Darlington transistor 38 and via a resistor 40 with the positive conductor 18.

Parallel to the base-collector path of transistor 30 is an RC series circuit of a capacitor 42 and a resistor 43. Similarly, parallel to the base-collector path of transistor 38 is an RC series circuit of a capacitor 45 and a resistor 46. The collector of transistor 30 is connected with one terminal of winding strand 12, whose other terminal is connected with positive conductor 18. The collector of transistor 38 is connected to a first terminal of winding strand 13, whose other terminal is likewise connected to positive conductor 18. The emitters of transistors 30 and 38 are connected to the negative conductor 19 via a common emitter resistor 47 (PTC) resistor, which serves as protection (fuse). In some cases, resistors 43 and 46 can have very small resistance values, or even zero values.

MODE OF OPERATION

Figure 3:
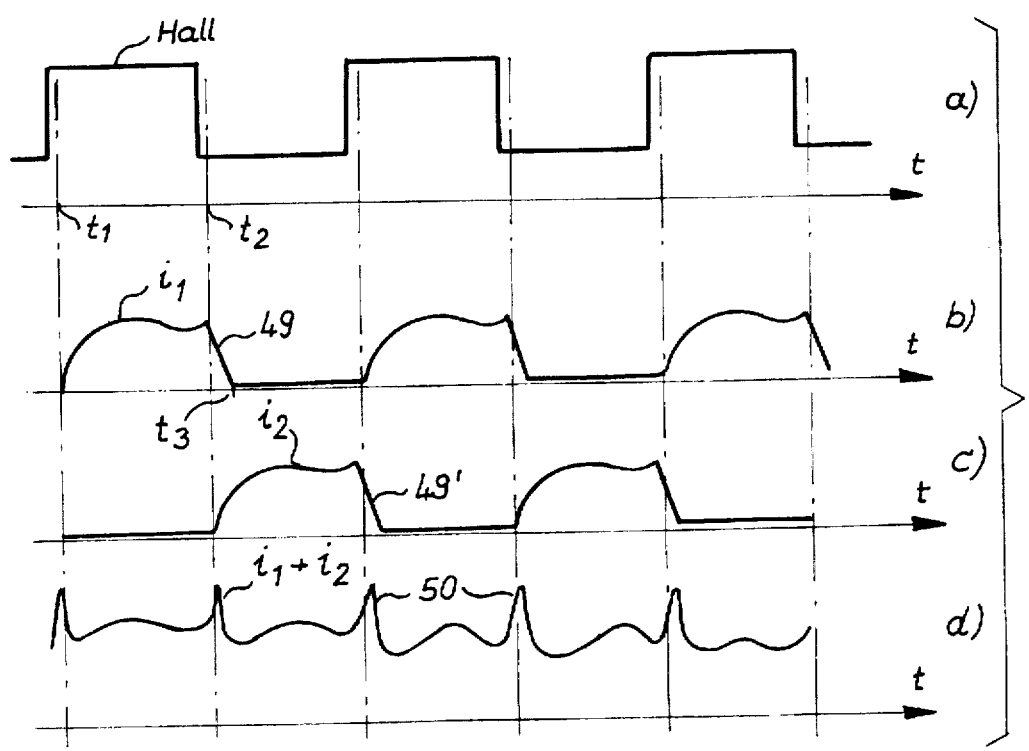
FIG. 3 is a set of signal graphs (a) through (d), drawn to a common time scale, which show how the FIG. 1 circuit operates.

In FIG. 3, graph (a) illustrates the signal at junction 26 at the output of Hall sensor 21, while graph (b) illustrates the current $i_1$ through transistor 30. These graphs show that transistor 30 switches on at time t1 with a small delay (caused by RC element 42, 43), whenever the Hall signal at output 26 goes high. Since output 26 is also connected to the gate of transistor 35, that becomes conducting and causes a voltage drop on the gate of transistor 38, which blocks (becomes non-conducting). The current $i_2$ through transistor 38 is shown in graph (c).

It is assumed that the motor is being driven with high voltage, and thus at high speed, so that the current $i_1$ through strand 12 has a high amplitude. As the Hall signal at time t2 goes negative, transistor 30 switches off, and this shutoff occurs with a relatively flat shutoff edge or slope 49, shown in graph (b), since this causes the previously charged-up capacitor 42 to discharge via the base of transistor 30. This shutoff delay lasts until time instant t3.

Simultaneously, transistor 35 turns off or blocks, causing transistor 38 to become conducting at time t2, and the current $i_2$ through strand 13 (see FIG. 1) is switched on, i.e. during the interval between t2 and t3, both currents $i_1$ and $i_2$ flow simultaneously. On the supply lead to motor 11, there result the current spikes 50 shown in graph (d). These generate disturbing motor noises in the form of structure-borne noise, and the operating efficiency of motor 11 is impaired or degraded, since these current spikes represent wasted energy. Further, the flat shutoff edges 49 (of $i_1$) and 49' (of $i_2$) cause, during maximum motor output, additional warming of transistors 30 and 38 which is very undesirable, since this reduces the output power of these transistors and shortens their lifetimes.

Figure 4:
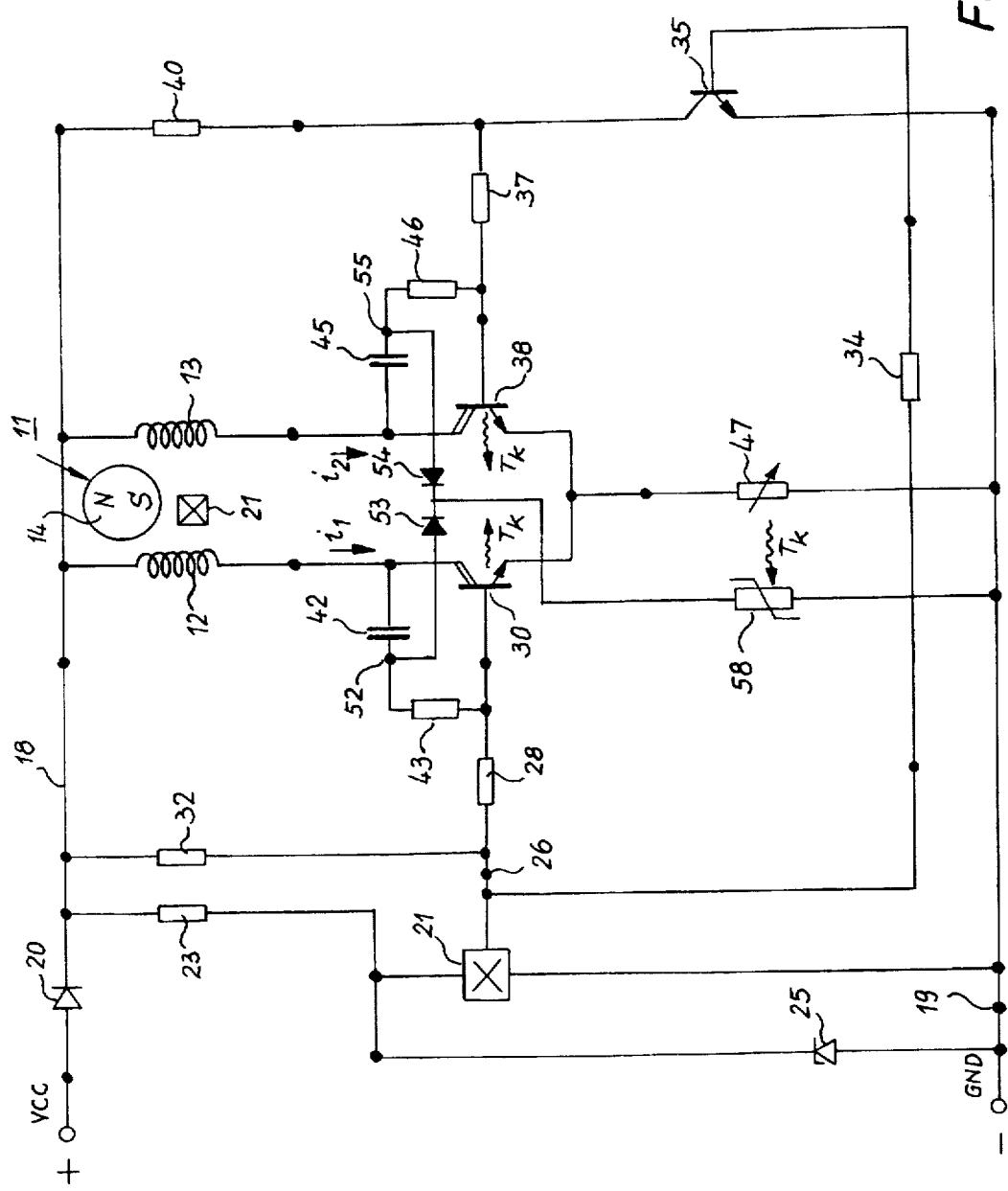
FIG. 4 is a circuit diagram of an electronically commutated motor according to the present invention, which includes means for noise reduction which are automatically disabled when the motor is heavily loaded, in order to protect the end-stage transistors.

FIG. 4 illustrates a circuit, which for the most part corresponds to that of FIG. 1. For this reason, the same reference numerals are used as there, and the identical elements are not described again.

The circuit of FIG. 4 has three additional circuit elements and these achieve the result that, at high rotational speeds of the motor and heavy loading of the end-stage transistors 30, 38, the shutoff edges of the pulses of currents $i_1$ and $i_2$ become increasingly steep.

For this purpose, at the junction point 52 between capacitor 42 and resistor 43, the anode of a diode 53 is connected. The cathode of diode 53 is connected to the cathode of another diode 54. The anode of diode 54 is connected to a junction point 55 between capacitor 45 and resistor 46. The cathodes of diodes 53 and 54 are connected via a Negative Temperature Coefficient (NTC) resistor 58 to the negative conductor 19. The resistance of an NTC resistor decreases as its temperature goes up.

As indicated symbolically by wavy arrows, there is a thermal coupling $T_k$ between transistors 30 and 38 and the NTC resistor 58. This can be achieved by, for example, putting all three components in contact with the same heat sink.

MODE OF OPERATION

As long as motor 11 is cold and transistors 30 and 38 thus have a low temperature, the behavior of this circuit corresponds to that of the circuit of FIG. 1, i.e. the two RC elements 42, 43 and 45, 46, respectively, generate relatively flat shutoff edges 49, 49', as shown in graphs (b) and (c) of FIG. 3. This is the case when, for example, motor 11 is driven with low voltage and accordingly low rotational speed. Under these conditions, the NTC resistor 58 has a high resistance value, so that it practically does not influence the functioning of the circuit.

However, if the temperatures of transistors 30 and 38 climb, due to loading of transistors 30 and 38 at high operating voltage, and thus high rotational speed, these increased temperatures are transmitted via the thermal coupling $T_k$ to the NTC resistor 58, and its resistance value goes down. Upon shutoff of a transistor 30 or 38, resistor 58 behaves as an additional base drain resistor for these transistors, i.e. as a current sink. This means that capacitors 42 or 45 are discharged faster during the shutoff process, and that the shutoff edges or slopes 61 (graph b of FIG. 5) and 61' (graph c of FIG. 5) become substantially steeper, i.e. the currents $i_1$ and $i_2$ practically no longer overlap in the commutation region, and, instead of the current spikes 50 shown in graph (d) of FIG. 3, one obtains in the commutation region the desired current gaps 62, as shown in graph (d) of FIG. 5.

Further, as a result of the steeper shutoff edges 61, 61', transistors 30 and 38 are significantly less stressed thermally, i.e. the arrangement of FIG. 4 serves as thermal protection for transistors 30 and 38.

The great advantage of the circuit of FIG. 4 is thus that the circuit adjusts itself automatically to the environmental and load conditions of motor 11, i.e. at low load and thus low temperature of transistors 30 and 38, these shutoff edges 61, 61' are flat, causing motor 11 to run quietly and without motor noise. Conversely, at high temperatures of transistors 30 and 38, the shutoff edges 61, 61' are steep, which means the motor noises increase, but the thermal loading of transistors 30 and 38 is automatically reduced, which markedly increases their lifetime and thereby the lifetime of motor 11.

Figure 6:
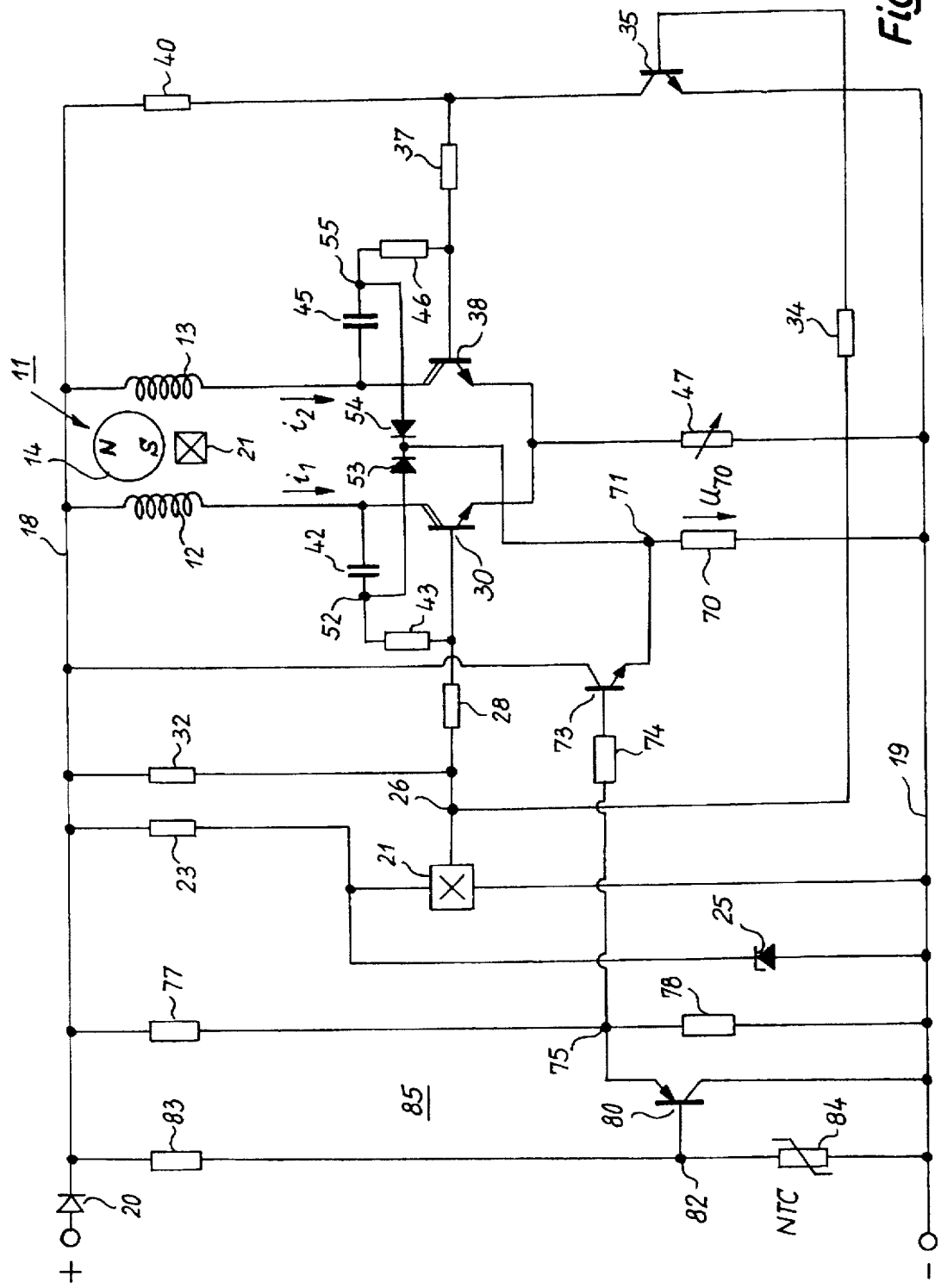
FIG. 6 is a diagram of a preferred variation of FIG. 4.

FIG. 6 shows a variation of the circuit of FIG. 4. Identical or identically functioning parts to those in FIGS. 1 and 4 are designated with the same reference numbers as there, and, to avoid redundancy, are not described again.

The NTC resistor 58 of FIG. 4 is here replaced by a resistor 70 with a fixed resistance value. The resistor's terminal 71, connected to diodes 53,54, serves as a current sink with variable potential, for the discharge of capacitors 42 and 45. Terminal 71 is connected to the emitter of an NPN transistor 73, which is arranged as an emitter follower, and whose collector is directly connected to positive conductor 18. The base of transistor 73 is connected via a resistor 74 to a junction point 75, which in turn is connected via a resistor 77 to positive conductor 18 and via a resistor 78 to negative conductor 19. Also connected to junction point 75 is the emitter of an NPN transistor 80, whose collector is connected to negative conductor 19. The base is connected to a junction point 82, which in turn is connected via a resistor 83 to positive conductor 18 and via an NTC (Negative Temperature Coefficient) resistor 84 to negative conductor 19.

As one immediately recognizes, the four resistors 77, 78, 83, and 84 form a bridge circuit 85, in whose diagonal (between junctions 75 and 82) the base-emitter path of transistor 80 is arranged. Whenever junction point 82 is more positive than junction point 75, transistor 80 conducts more or less strongly, corresponding to the potential difference, and thus operates as a parallel resistance to resistor 78 of the bridge 85, causing the potential of junction point 75 to be lowered. This is the case whenever the NTC resistor 84 is warmed up, since then the resistance value of this resistor 84 decreases. Thus, in this situation, transistor 80 serves to bring bridge 80 into an approximately compensated or equalized state, i.e. when rising temperature makes resistance 84 smaller, the parallel circuit of resistor 78 and transistor 80 also assumes a lower resistance value, so that the voltage on it decreases.

If the voltage or potential at junction 75 decreases, the potential at the base of transistor 73 becomes less positive, i.e. the current through transistor 73 drops off and the voltage $U_{70}$ also drops off. This means stronger discharging currents can flow respectively from capacitors 42, 45 via diodes 53, 54 to resistor 70, and, indeed, the warmer the NTC resistor 84 becomes, the smaller the voltage $U_{70}$ gets. This has the consequence that the steepness of the shutoff slopes (61, 61' in respective graphs b and c of FIG. 5) becomes ever greater as the temperature of NTC resistor 84 increases, i.e. the steepness of shutoff slopes 61, 61' grows with rising temperature of NTC resistance 84, causing the power losses in transistors 30, 38 to be correspondingly reduced.

Conversely, when the temperature of NTC resistor 84 drops, the shutoff slopes 61, 61' become flatter, because transistor 80 becomes less and less conductive, causing the potential at junction 75 to become more positive, which in turn causes emitter-follower transistor 73 to conduct more strongly. The voltage $U_{70}$ at resistor 70 continues rising, and a smaller discharging current flows via diodes 53, 54 from capacitors 42, 45, so that the discharge of these capacitors takes longer, and, therefore, the shutoff slopes become ever flatter. Point 71 thus serves as a current sink with variable potential.

Whenever junction points 75 and 82 have the same potential, or when the potential of point 82 is more positive than the potential of point 75, transistor 80 blocks. This is thus the case, whenever NTC resistor 84 is very cold and therefore has a high resistance value. In this case, junction point 75 assumes approximately the potential determined by the voltage-divider ratio of resistors 77, 78, i.e. the rise of the potential at junction point 75 is limited to a predetermined maximum value, e.g. +4 volts. The voltage at point 75 cannot climb higher. This prevents the shutoff slopes 61, 61' (FIG. 5) from getting too flat at very low temperatures. One thus obtains a limitation on the flattening of the shutoff slopes a low temperatures.

NTC resistor 84 can (as in FIG. 4) be in thermal contact with transistors 30 and/or 38, in order to sense their temperature(s). Alternatively, it can be located, for example, at a hot spot of a device (not shown) which is intended to be cooled by the fan 15 driven by motor 11. The hot spot can be, e.g. the power supply of a computer, and the NTC resistor 84 can be located adjacent this power supply, to sense its temperature. This resistor 84 can additionally serve to regulate the rotation speed of motor 11, so that it runs faster at high temperatures than at low temperatures. This characteristic is very useful in fans 15 which serve to ventilate computers. This is explained below, with reference to FIG. 7.

Figure 5:
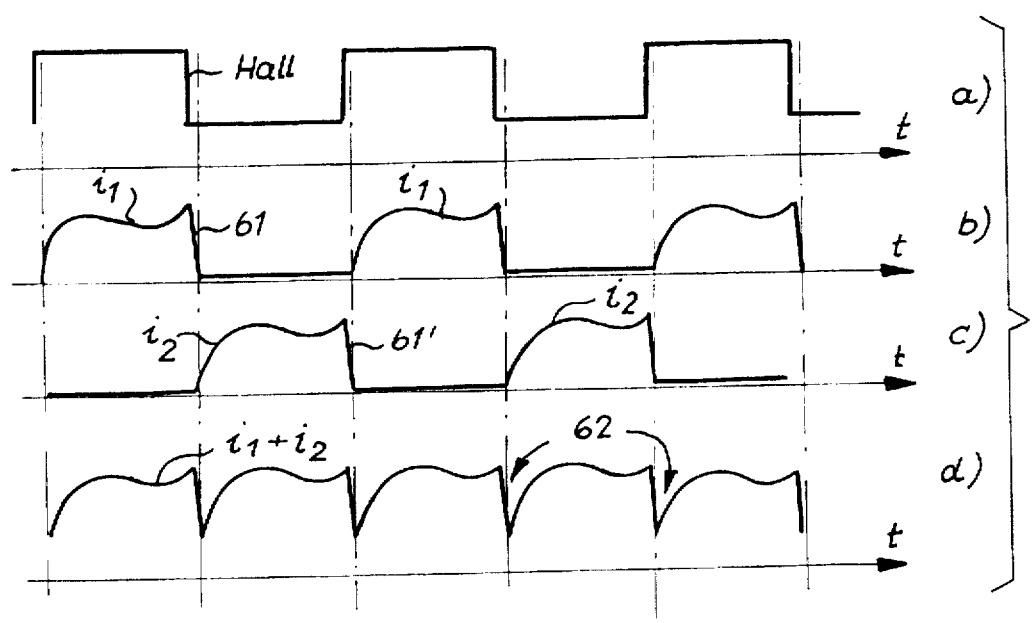
FIG. 5 is a set of signal graphs (a) through (d), drawn to a common time scale, which show how the FIG. 4 circuit operates.
Figure 7:
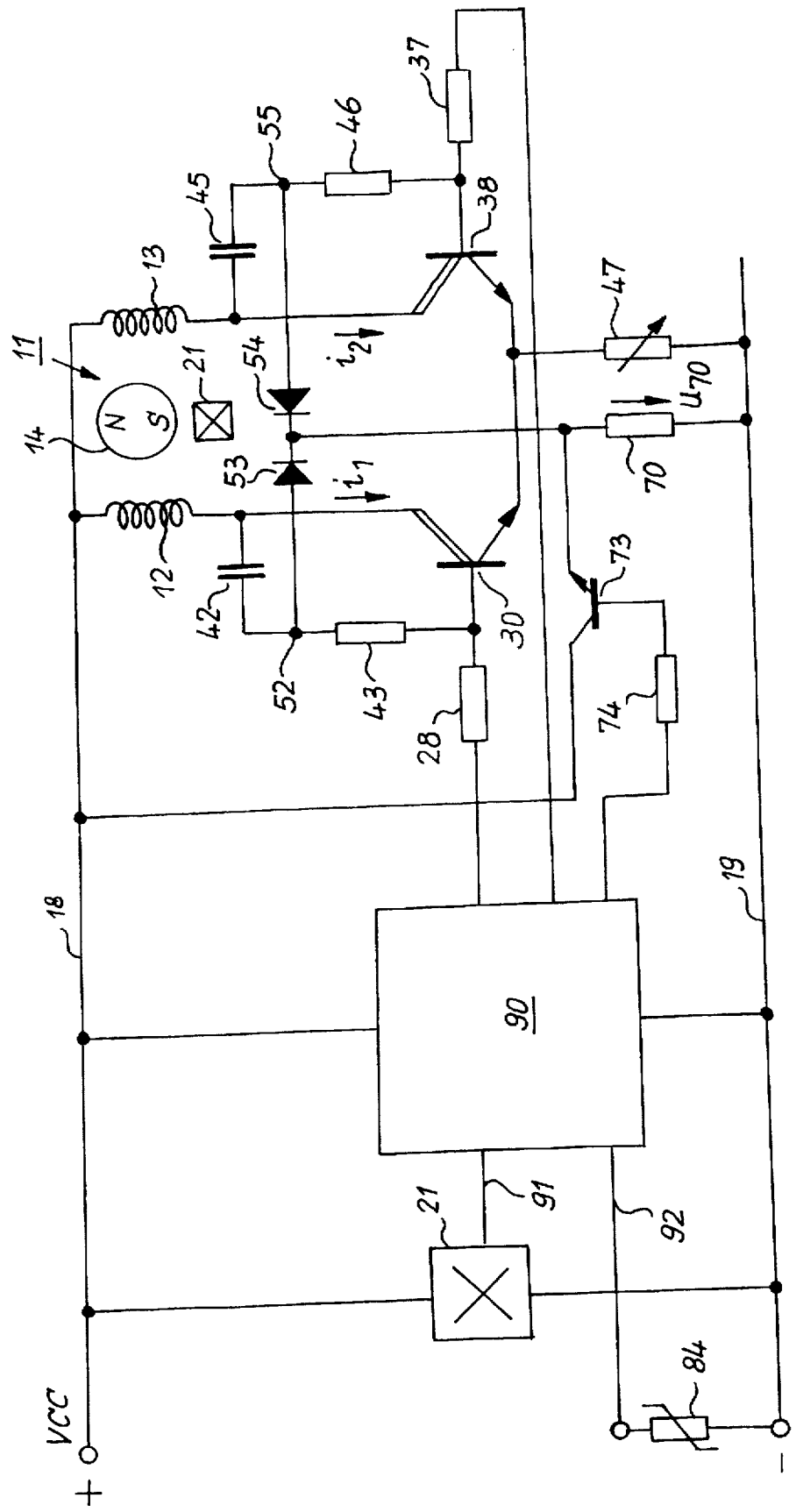
FIG. 7 is a schematic diagram illustrating the basic principle of the invention, as applied in a motor, in which the rotation speed is controlled as a function of temperature at a temperature-dependent resistor 84.

FIG. 7 shows, in schematized form, a circuit having a motor 11 which runs faster when temperature of NTC resistor 84 is elevated. Identical, or identically-functioning, parts as those in FIGS. 1, 4 & 5 are designated with the same reference numerals and, to avoid redundancy not described again.

To control the commutation between transistors 30 and 38, there is provided a device 90 which contains a phase-inversion transistor 35 (not shown) as discussed above, and which has a first input 91 to receive signals from a Hall IC 21. A second input 92 of device 90 receives a temperature signal from the NTC resistor 84. This temperature signal effects such a regulation of transistors 30 and 38 that motor 11 runs faster at high temperatures than at low temperatures. Further, as explained in detail above with reference to the FIG. 6 embodiment, this temperature signal can be used, in the same manner, to control the voltage $U_{70}$, in order to regulate the slope steepness of the shutoff slopes or edges of current pulses $i_1$ and $i_2$ as a function of the temperature signal.

Figure 8:
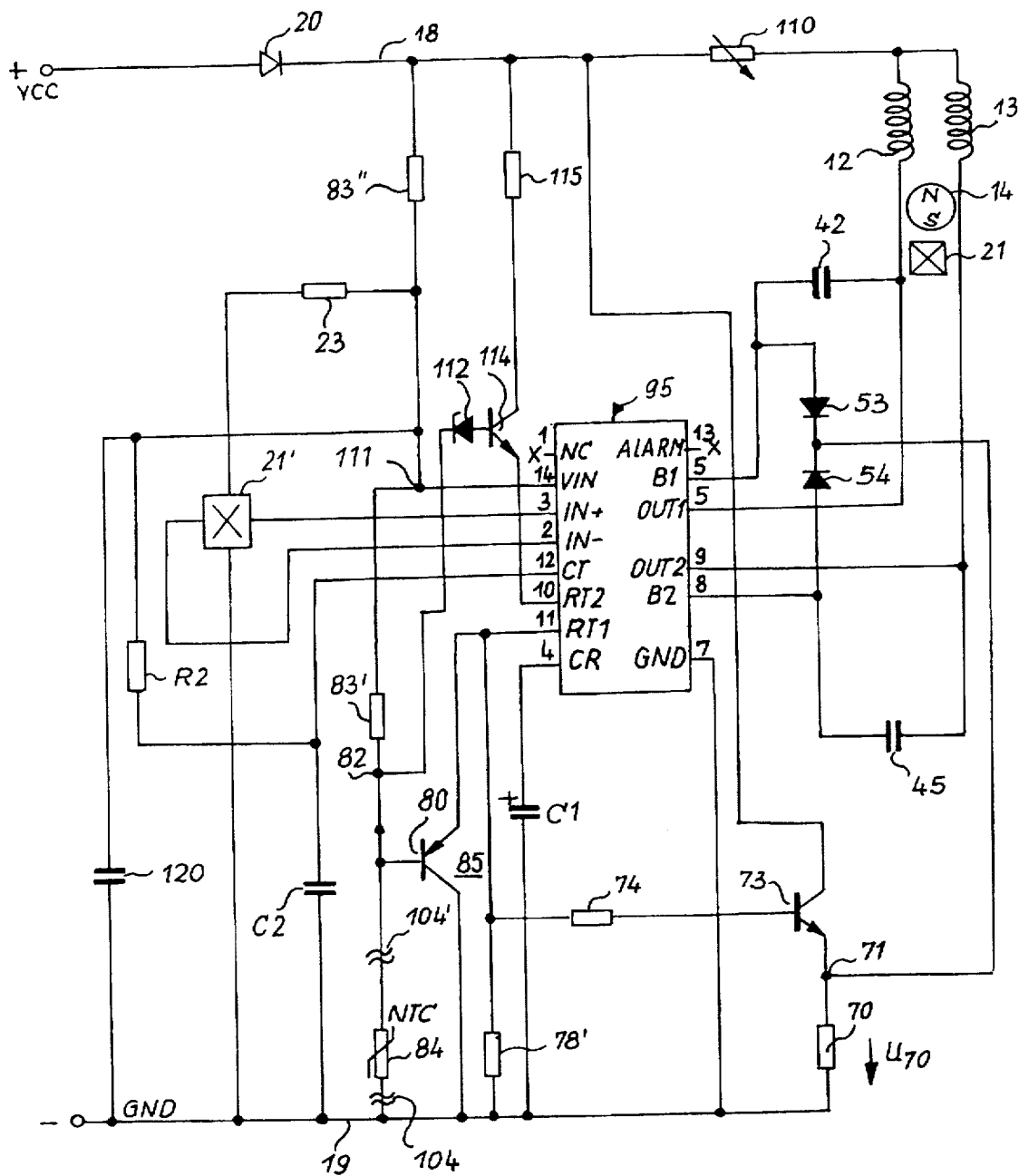
FIG. 8 is a detailed circuit diagram analogous to FIG. 7, for a motor whose rotation speed depends upon the temperature at a temperature-dependent resistor 84, and special noise-reducing steps are carried out when rotation speed is low.

FIG. 8 shows a practical embodiment of the circuit shown in principle in FIG. 7. The structure of this circuit of FIG. 8 is analogous to that of FIG. 6, and therefore identical or identically working parts are designated with the same reference numerals and usually not described again.

Figure 9:
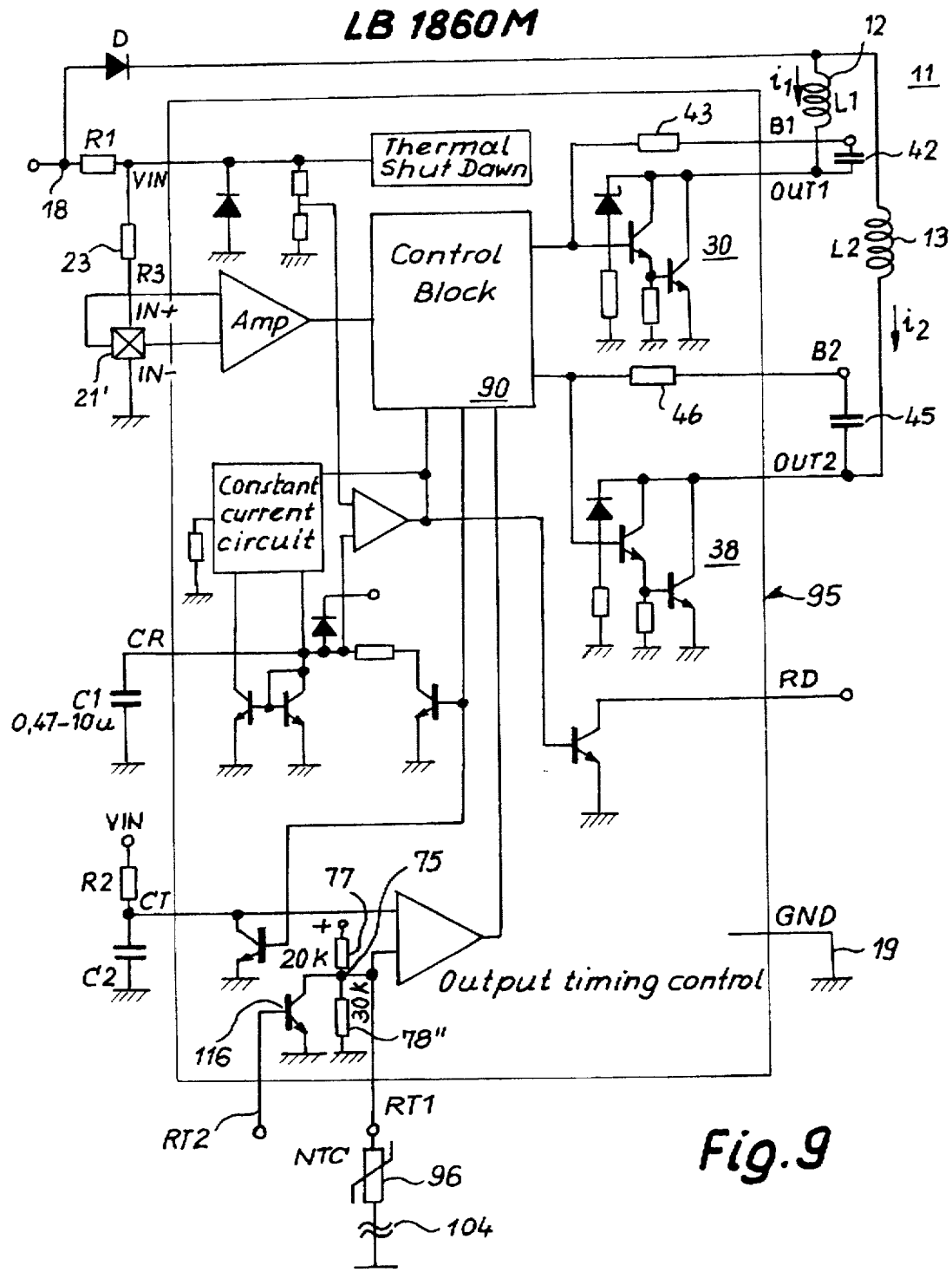
FIG. 9 illustrates the principal structure of an Integrated Circuit (IC), as it could be used in the circuit of FIG. 8.
Figure 10:
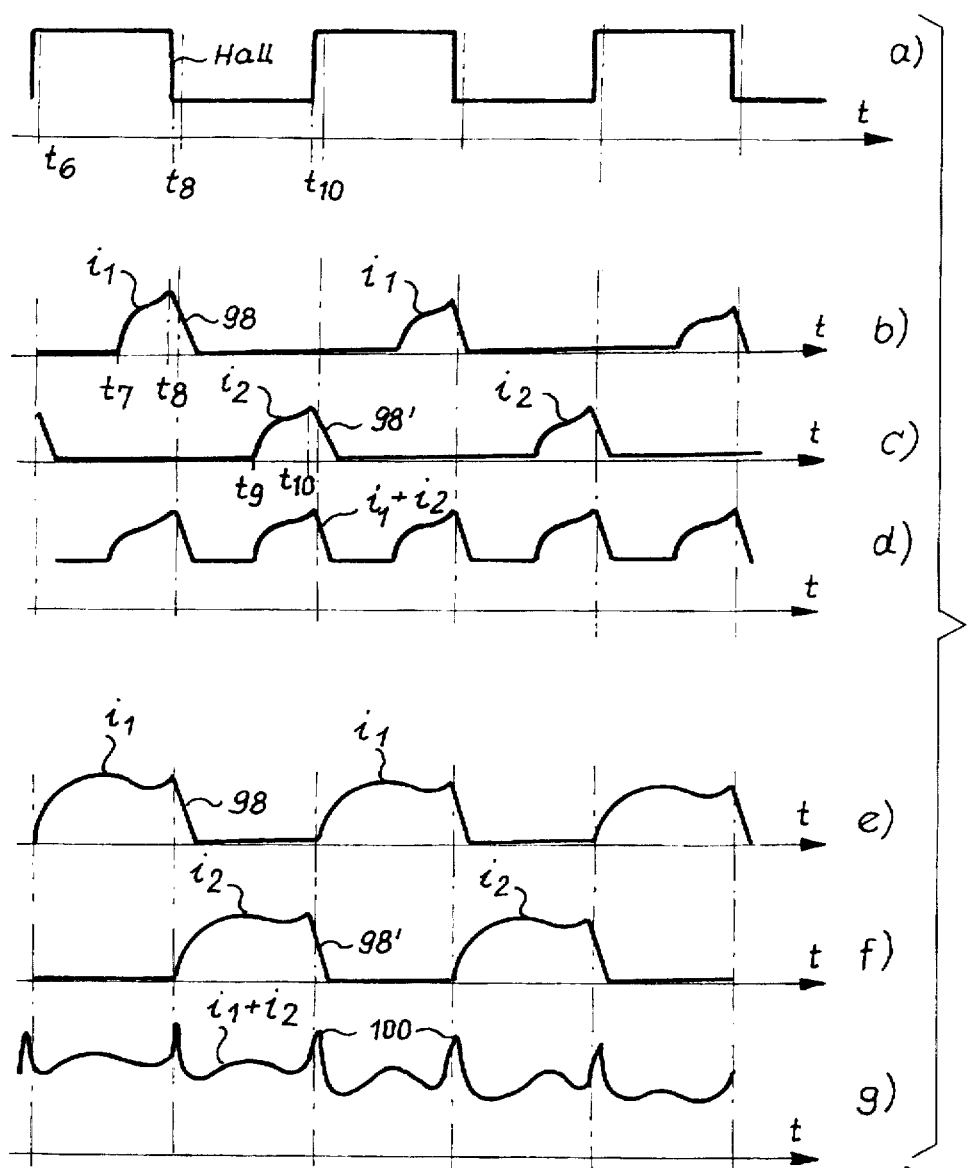
FIG. 10 is a set of signal graphs (a) through (g), drawn to a common time scale, which show how the FIG. 8 circuit operates.
Figure 11:
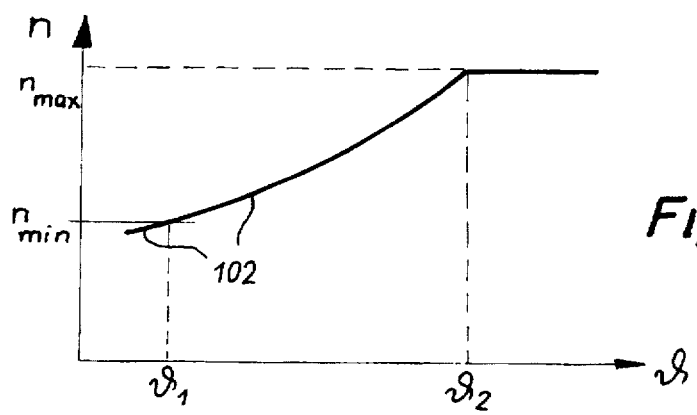
FIG. 11 is a diagram explaining the circuit of FIG. 8.

The circuit of FIG. 8 can be suitably implemented using, for example, an Integrated Circuit (IC) 95 from SANYO, model LB1860M. This is a commercially available IC, for details of which the reader is directed to the manufacturer's datasheets. FIG. 9 shows the principal internal structure, according to datasheets. FIG. 10 shows the associated current curve graphs (a)-(g), and FIG. 11 shows the associated graph of rotation speed n versus temperature theta. IC 95 contains—integrated—a portion of the components of FIG. 7, namely both Darlington transistors 30, 38, the commutation circuit 90 which controls them, and resistors 28, 37, 43, and 46, with resistors 43 and 46 having respective terminals B1 and B2 to enable capacitors 42 and 45 to be connected externally, as shown. Using the RC series circuits 43, 42 and 46, 45, respectively, the shutoff slopes of current pulses $i_1$ and $i_2$ can be made flatter, in the manner already described, to reduce motor noise.

IC 95 has altogether 14 terminals or pins, which are designated with datasheet symbols such as RT1, RT2, etc. and these same symbols are used in FIG. 8, so these designations need not be detailed here.

As FIG. 9 illustrates, with IC 95, one can connect an NTC resistor 96 between input RT1 and negative conductor 19. The rotation speed of motor 11 is then regulated as a function of the temperature of NTC resistor 96. This is explained, with reference to FIG. 10. This shows in graph a, just as in FIGS. 2 & 5, the signal Hall at one of the outputs of Hall generator 21' of FIG. 9.

At low temperatures of NTC resistor 96, each pulse of current $i_1$ through motor winding 12 is switched on relatively long after the instant $t_6$ when the Hall signal becomes positive, namely at instant $t_7$. This current pulse $i_1$ is switched off at the instant $t_8$ when the Hall signal goes negative again, but the shutoff is retarded by the RC-element 43, 42, so that a shutoff edge 98 with a flat slope results.

Current pulses $i_2$ through motor winding 13 are, in an analogous manner, switched on at an instant $t_9$ which is substantially delayed with respect to instant $t_8$ and switched off at an instant $t_{10}$ at which the Hall signal becomes positive again. Here again, the RC circuit 46, 45 effects a gentle shutoff, with a less steep shutoff slope 98'.

If the temperature at NTC resistor 96 rises, the current pulses of $i_1$ and $i_2$ are switched on correspondingly earlier and last longer.

The curves in graphs e, f, and g of FIG. 10 show the current pulses $i_1$ and $i_2$ at the maximum rotational speed $n_{max}$ of FIG. Since here the RC elements 43, 42 and 46, 45 are equally effective, one obtains in this case the relatively flat shutoff slopes 98, 98', resulting in an overlap of the current pulses $i_1$ and $i_2$. This reduces the maximum possible rotational speed $n_{max}$ and gives rise to losses through current spikes 100, which occur at respective commutations (see graph g of FIG. 10).

Therefore, in practice, one is forced to leave off the capacitors 42 and 45 at the terminals of IC 95, which leads at low rotational speeds to distracting motor noises, because the shutoff edges 98 (FIG. 10, graph b) and 98' (FIG. 10, graph c) become very steep, which leads to magnetostrictive noises in motor 11 and to structure-borne noises and rumblings.

A further problem associated with IC 95 is that, at very low temperatures, e.g. in winter in an unheated room, the rotation speed n of motor 11 becomes very low, as shown in FIG. 11 by curve 102.

In general, it would be desirable, not to let this rotational speed go too low, i.e. to set a lower limit value, below which the actual rotational speed is not permitted to go. A further disadvantage lies in the fact that, in the event of a break or interruption of the conductors to NTC resistor 96, e.g. at position 104 (FIG. 9), the rotation speed of motor 11 assumes its smallest possible value, even at very high temperatures. Most desirable would be, in such a case, for motor 11 to run at its maximum possible speed, so that reliable cooling under all circumstances is assured.

FIG. 8 illustrates a circuit of the invention which provides a significant improvement: the motor noises at low speed are low because the shutoff slopes 98, 98' in graphs b and c of FIG. 10 are less steep. Conversely, the shutoff edges at high speeds are steep like the edges 60, 61 shown in FIG. 5, graphs b and c. The motor rotation speed is, at very low temperatures, limited to a value $n_{min}$ which cannot be "undershot" or gone below. If the conductor to NTC resistor 84 is broken, e.g. at position 104 or 104' (FIG. 8), the motor 11 runs at its maximum possible speed.

The circuit of FIG. 8 corresponds for the most part with that of FIG. 6, so identical or identically-functioning parts are designated with the same reference numerals as there. Modifications are described below.

According to the FIG. 8 embodiment, in the line 18 leading to motor windings 12,13 is a PTC (Positive Temperature Coefficient) resistor 110, which provides protection against overload to motor 11. A common emitter resistor for transistors 30 and 38 is not provided in IC 95.

In place of the resistor 78 used in FIG. 6, one uses, in FIG. 8, a parallel circuit of two resistances, namely an external resistor 78' and an internal resistor 78" inside IC 95 (FIG. 9). The resistor 77 of FIG. 6 (top left) is found in FIG. 8 inside IC 95, as shown in FIG. 9. The emitter of transistor 80 and one terminal of resistor 78' are therefore connected to terminal RT1 of IC 95.

Resistor 83 of FIG. 6 is replaced by the series circuit of two resistors 83' and 83", whose junction point 111 is connected to the input VIN of IC 95.

The junction point 82 of resistor 83' and of NTC resistor 84 is connected to the cathode of a Zener diode 112, whose anode is connected to the base of an NPN transistor 114, whose emitter is connected to input RT2, and whose collector is connected via a resistor 115 with positive conductor 18.

The components 112, 114, and 115 assure that, in the event of a break of the line to NTC resistor 84 at position 104 or 104', motor 11 will run at its maximum possible rotational speed. In this case, junction point 82 is impressed with such a positive potential that Zener diode 112 becomes conductive (breaks down) and controls NPN transistor 114 into a conductive state. This supplies, to input RT2 of IC 95, a base current for the PNP transistor 116 (FIG. 9), so that this transistor 116 becomes fully conductive and short-circuits resistors 78' and 78". In this manner, the potential at junction point 75 (FIG. 9) becomes substantially more negative, and this signal means to IC 95 that motor 11 should run at maximum RPM, causing long current pulses $i_1$ and $i_2$ as shown in FIG. 5, graphs b and c, to be generated.

The two outputs of Hall device 21' are connected respectively to inputs IN+ and IN− of the IC 95. Input CT is, as shown in FIG. 9, connected via a capacitor C2 to the negative conductor 19 and via a resistor R2 to junction point 111. A smoothing capacitor 120 lies between junction 111 and negative conductor 19.

The circuit connection of transistor 80 corresponds to that of FIG. 6, i.e. its base-emitter path lies in the diagonal of bridge 85 between junction point 75 (FIG. 9), corresponding to input RT1, and junction point 82. In this manner, one prevents, as described in detail with reference to FIG. 6 above, the potential at point 75, corresponding to input RT1, from climbing over a predetermined value, e.g. over 4 volts. This voltage corresponds to the rotation speed $n_{min}$ (FIG. 11); in other words, this speed or RPM value cannot be gone below.

As temperatures rise and the rotation speed of motor 11 rises correspondingly, the resistance value of NTC resistor 84 declines, which makes transistor 80 more strongly conductive, lowering the potential at input RT1. Similarly, the potential on the base of transistor 73 goes down, so this transistor conducts less, and the voltage $U_{70}$ at resistor 70 declines. In this manner, as described in detail with reference to FIG. 6, capacitors 42 and 45 discharge more quickly (via resistor 70 and via respective diodes 53, 54), whenever the motor rotation speed n increases, and the steepness of shutoff slopes or edges 61, 61' (FIG. 5) increases with increasing rotational speed. However, the steepness is low at low rotation speeds, so the thus-modified motor 11 runs as quietly, at low rotation speeds, as the customers of PAPST fans have come to expect.

In a preferred embodiment shown in FIG. 8, the speed of motor 11 is regulated according to the temperature at NTC resistor 84, and this temperature also controls the edge steepness of the shutoff edges 98, 98' (FIG. 10), i.e. this edge steepness is an indirect function of the rotation speed of the motor, according to the following relationships:

low rotation speed=low slope steepness;

high rotation speed=high slope steepness.

Instead of such an indirect control scheme, it would also be possible to directly control the edge steepness according to the motor speed or RPM. For example, one could, in FIG. 8, feed to the base of transistor 73 an RPM-dependent signal, i.e. at low speeds this transistor must receive a high base current, so that voltage $U_{70}$ becomes large, and a small slope steepness results, and conversely, at high speeds, transistor 73 must receive little or no base current, so that voltage $U_{70}$ becomes low and the shutoff edges become steep. However, this would require generation of an RPM-dependent signal with very low ripple, which is costly in circuitry terms, while the signal at the NTC resistor 84 is already available, exhibits no ripple or waviness, and is simple to process. Naturally, one could, for example, vary resistors 43 and 46 as a function of RPM or temperature, to the extent that they are not (as in FIG. 8) located inside an IC and thus inaccessible.

Those skilled in the art will recognize that, within the scope of the present invention, numerous variations and modifications are possible. For example, features of one of the above-described embodiments could be combined with features of another embodiment. Thus, the invention is not limited to the particular embodiments shown and described, but rather is defined by the following claims.

What is claimed is:

1. An electronically commutated motor (11), whose speed is variable, wherein the motor has a rotor (14);

the motor has at least one stator winding phase (12,13);

a controllable semiconductor having a control electrode controlling current pulses flowing through said at least one stator winding phase; and an RC-series combination comprising a capacitor connected in series with a resistor via a connecting point (52,55), said capacitor being connected to an output electrode of said controllable semiconductor;

said resistor being connected to said control electrode and a temperature-dependent resistor forming a discharge path for said capacitor and connected to said connecting point to increase the steepness of the shutoff edges as the temperature of said temperature-dependent resistor increases.

2. The motor of claim 1, wherein the control circuit (58) senses the temperature of power semiconductors (30, 38) in the circuit of the motor, and so controls the steepness controller that the slope steepness (61, 61') is increased as the semiconductor temperature increases.

3. The motor of claim 1, wherein the temperature-dependent resistor is thermally connected with a power semiconductor of the motor and thereby senses the temperature thereof.

4. A motor according to claim 1 or 2 or 3, wherein the steepness controller comprises at least one series circuit of a capacitor (42, 45) and a resistor (43, 46) and said series circuit is connected between an output electrode and a control electrode (B) of a semiconductor (30,38) which controls current passing through said motor (11).

5. A motor according to claim 4, wherein the control circuit regulates flow of charge between said capacitor (42, 45) and another circuit component, as a function of at least one of temperature and motor rotation speed.

6. A motor according to claim 5, further comprising a diode (53, 54) connected between said control circuit and said capacitor (42, 45) of said at least one series circuit.

7. An electronically commutated motor comprising:

a rotor;

a stator having at least one stator phase winding;

a controllable semiconductor having a control electrode controlling current pulses flowing through said at least one stator phase winding;

an RC-series combination comprising a capacitor connected in series with a resistor via a connecting point (52, 55), the capacitor being connected to an output electrode of said controllable semiconductor, the resistor being connected to said control electrode;

and a current sink (71) connected to said connecting point, said current sink having a voltage which is variable as a function of at least one of motor rotation speed and a parameter determining said speed.

8. A motor according to claim 5, wherein the control circuit includes a temperature-dependent resistor (58, 84).

9. A motor according to claim 8, wherein the temperature-dependent resistor is connected in a discharge path of said capacitor (42, 45) of said at least one series circuit.

10. A motor according to claim 8, wherein said temperature-dependent resistor (84) is part of a bridge circuit (85) which includes, in a diagonal branch (75-82) thereof, a semiconductor (80) which improves equalization in said bridge circuit by controlling a voltage level in said branch;

and a voltage in a branch (78) of said bridge circuit controls voltage of a current sink (71) in the control circuit.

11. A motor according to claim 8, wherein the temperature-dependent resistor has a negative temperature coefficient (NTC).

12. A motor according to claim 8, wherein the rotation speed of the motor (11) is dependent on the resistance value of the temperature-dependent resistor (84).

13. A motor according to claim 8, wherein the resistance value of the temperature-dependent resistor (84) has, beyond a predetermined limit value, no further influence on the operation of the motor (11), as commanded by the control circuit.

14. A motor according to claim 13, wherein the control circuit does not react to a sensed value of the temperature-dependent resistor falling outside a predetermined resistance value range by further varying the control signals applied to the steepness controller.

* * * * *